(12) United States Patent
Bao et al.

(10) Patent No.: US 10,141,154 B2
(45) Date of Patent: Nov. 27, 2018

(54) ARRAY SUBSTRATE, DISPLAY PANEL AND DISPLAY APPARATUS HAVING THE SAME, AND FABRICATING METHOD THEREOF

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Zhiying Bao, Beijing (CN); Xiaochuan Chen, Beijing (CN); Wenbo Jiang, Beijing (CN); Shijun Wang, Beijing (CN); Lei Wang, Beijing (CN); Yue Li, Beijing (CN); Yanna Xue, Beijing (CN); Zhenhua Lv, Beijing (CN); Wenjun Xiao, Beijing (CN); Yong Zhang, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

(*) Notice: Subject to any disclaimer, the term of this patent is extended or adjusted under 35 U.S.C. 154(b) by 0 days.

(21) Appl. No.: 15/786,479

(22) Filed: Oct. 17, 2017

(65) Prior Publication Data

US 2018/0040451 A1    Feb. 8, 2018

Related U.S. Application Data

(63) Continuation of application No. 15/107,090, filed as application No. PCT/CN2015/099233 on Dec. 28, 2015, now Pat. No. 9,831,059.

(30) Foreign Application Priority Data

May 13, 2015  (CN) .......................... 2015 1 0242967

(51) Int. Cl.
*H01J 29/02*    (2006.01)
*H01J 9/02*    (2006.01)
(Continued)

(52) U.S. Cl.
CPC ............ *H01J 29/021* (2013.01); *H01J 9/025* (2013.01); *H01J 9/185* (2013.01); *H01J 29/32* (2013.01);
(Continued)

(58) Field of Classification Search
CPC .......... H01J 29/021; H01J 29/96; H01J 29/32; H01J 9/025; H01J 9/185; H01J 31/127;
(Continued)

(56) References Cited

U.S. PATENT DOCUMENTS

2005/0248256 A1* 11/2005  Song ....................... H01J 29/06
                                                                   313/495
2006/0038479 A1    2/2006  Fukuoka et al.
(Continued)

FOREIGN PATENT DOCUMENTS

CN    1286500 A    3/2001
CN    1296632 A    5/2001
(Continued)

OTHER PUBLICATIONS

International Search Report & Written Opinion dated Mar. 31, 2016, regarding PCT/CN2015/099233.
(Continued)

*Primary Examiner* — Kevin Quarterman
(74) *Attorney, Agent, or Firm* — Intellectual Valley Law, P.C.

(57) ABSTRACT

The present application discloses an array substrate comprising a first substrate, a first electrode on the first substrate, a passivation layer on a side of the first electrode distal to the first substrate, the passivation layer comprising a plurality of
(Continued)

first vias, each of which corresponds to a different part of the first electrode, an electron emission source layer on a side of the first electrode distal to the first substrate comprising at least one electron emission source in each of the plurality of first vias, and a dielectric layer on a side of the first electrode distal to the first substrate comprising a plurality of dielectric blocks corresponding to the plurality of first vias, at least a portion of each of the plurality of dielectric blocks in each of the plurality of first vias. The at least one electron emission source comprises a first portion having a first end and a second portion having a second end. The first end is in contact with the first electrode, the first portion is within a corresponding one of the plurality of dielectric blocks. The second portion and the second end are outside the corresponding one of the plurality of dielectric blocks.

20 Claims, 4 Drawing Sheets

(51) Int. Cl.
| | | |
|---|---|---|
| *H01J 9/18* | (2006.01) | |
| *H01J 31/12* | (2006.01) | |
| *H01J 29/96* | (2006.01) | |
| *H01J 29/32* | (2006.01) | |
| *H01L 27/12* | (2006.01) | |
| *G09G 3/20* | (2006.01) | |

(52) U.S. Cl.
CPC .......... *H01J 29/96* (2013.01); *H01J 31/127* (2013.01); *H01L 27/124* (2013.01); *H01L 27/1248* (2013.01); *H01L 27/1259* (2013.01); *G09G 3/2092* (2013.01); *H01J 2209/0223* (2013.01); *H01J 2229/186* (2013.01)

(58) Field of Classification Search
CPC ........ H01J 2229/186; H01J 2209/0223; H01L 27/124; H01L 27/1259; H01L 27/1248; G09G 3/2092
See application file for complete search history.

(56) References Cited

U.S. PATENT DOCUMENTS

| | | | |
|---|---|---|---|
| 2007/0096618 A1* | 5/2007 | Moon | ........... H01J 1/304 313/310 |
| 2013/0249382 A1 | 9/2013 | Lee et al. | |
| 2013/0264307 A1 | 10/2013 | Lin et al. | |

FOREIGN PATENT DOCUMENTS

| | | |
|---|---|---|
| CN | 1630001 A | 6/2005 |
| CN | 1756449 A | 4/2006 |
| CN | 103270571 A | 8/2013 |
| EP | 1073090 A2 | 1/2001 |
| JP | 7254355 A | 10/1995 |
| KR | 20070046631 A | 5/2007 |
| WO | 0054299 A1 | 9/2000 |

OTHER PUBLICATIONS

First Office Action in the Chinese Patent Application No. 201510242967.5, dated Aug. 24, 2016; English translation attached.
Second Office Action in the Chinese Patent Application No. 201510242967.5, dated Jan. 3, 2017; English translation attached.
Third Office Action in the Chinese Patent Application No. 201510242967.5, dated Mar. 8, 2017; English translation attached.
First Office Action in the U.S. Appl. No. 15/107,090, dated Apr. 7, 2017.
Response to First Office Action in the U.S. Appl. No. 15/107,090, dated May 3, 2017.
Final Office Action in the U.S. Appl. No. 15/107,090, dated Jul. 12, 2017.
Response to Final Office Action in the U.S. Appl. No. 15/107,090, dated Aug. 25, 2017.

* cited by examiner

ARRAY SUBSTRATE, DISPLAY PANEL AND DISPLAY APPARATUS HAVING THE SAME, AND FABRICATING METHOD THEREOF

CROSS-REFERENCE TO RELATED APPLICATION

This application is a continuation of U.S. application Ser. No. 15/107,090 filed Dec. 28, 2015, which is a national stage application under 35 U.S.C. § 371 of International Application No. PCT/CN2015/099233 filed Dec. 28, 2015, which claims priority to Chinese Patent Application No. 201510242967.5, filed May 13, 2015. Each of the forgoing applications is herein incorporated by reference in its entirety for all purposes.

FIELD

The present invention relates to display technology, more particularly, to an array substrate, a display panel and a display apparatus having the same, and a fabricating method thereof.

BACKGROUND

As compared to traditional liquid crystal display apparatus, field emission display (FED) apparatus have better display qualities, faster response, a smaller thickness, a wider viewing angle, and a much wider range of operating temperatures. In a field emission display apparatus, a voltage is applied on an electron emission source, causing electron tunneling through surface potential barrier of the electron emission source. Light emission is achieved from a phosphor bombarded by electrons emitted from the electron emission source. Because field emission displays are self-emitting displays that do not require a backlight, they can be made much thinner as compared to liquid crystal displays.

SUMMARY

In one aspect, the present invention provides an array substrate comprising a first substrate, a first electrode on the first substrate, a passivation layer on a side of the first electrode distal to the first substrate, the passivation layer comprising a plurality of first vias, each of which corresponds to a different part of the first electrode, an electron emission source layer on a side of the first electrode distal to the first substrate comprising at least one electron emission source in each of the plurality of first vias, and a dielectric layer on a side of the first electrode distal to the first substrate comprising a plurality of dielectric blocks corresponding to the plurality of first vias, at least a portion of each of the plurality of dielectric blocks in each of the plurality of first vias.

Optionally, the at least one electron emission source comprises a first portion having a first end and a second portion having a second end.

Optionally, the first end is in contact with the first electrode, the first portion is within a corresponding one of the plurality of dielectric blocks.

Optionally, the second portion and the second end are outside the corresponding one of the plurality of dielectric blocks.

Optionally, the array substrate further comprises an electron absorption layer on a side of the passivation layer distal to the first electrode, the electron absorption layer comprising a plurality of second vias, each of which corresponds to a corresponding one of the plurality of first vias.

Optionally, each of the plurality of second vias is no smaller than the corresponding one of the plurality of first vias.

Optionally, the electron absorption layer is a ground metal layer or a grid electrode plate.

Optionally, the array substrate further comprises a gate electrode on the first substrate, a gate insulating layer on a side of the gate electrode distal to the first substrate, an active layer on a side of the gate insulating layer distal to the first substrate, and a source electrode and a drain electrode on a side of the active layer distal to the first substrate.

Optionally, the first electrode is on a side of the gate insulating layer distal to the first substrate, and is connected to the drain electrode.

Optionally, the dielectric layer is made of a material comprising resin.

Optionally, the at least one electron emission source has a one-dimensional or quasi-one-dimensional structure.

Optionally, the at least one electron emission source is a nano-structure having a shape selected from a group consisting of a rod, a wire, and a cone.

Optionally, the at least one electron emission source is made of one or a combination of a carbon nano-tube and a semiconductor oxide.

Optionally, the carbon nano-tube is a doped carbon nano-tube, and the semiconductor oxide is a doped semiconductor oxide.

In another aspect, the present invention provides a method of fabricating an array substrate, comprising forming a first electrode on a first substrate; forming a passivation layer on a side of the first electrode distal to the first substrate; forming a plurality of first vias in the passivation layer, each of which corresponds to a different part of the first electrode; forming an electron emission source layer on a side of the first electrode distal to the first substrate, the electron emission source layer comprising at least one electron emission source in each of the plurality of first vias; and forming a dielectric layer on a side of the first electrode distal to the first substrate comprising a plurality of dielectric blocks corresponding to the plurality of first vias, at least a portion of each of the plurality of dielectric blocks in each of the plurality of first vias.

Optionally, the at least one electron emission source comprises a first end and a second end, a first portion having the first end, and a second portion having the second end.

Optionally, the first end is in contact with the first electrode, the first portion is within a corresponding one of the plurality of dielectric blocks.

Optionally, the second portion and the second end is outside the corresponding one of the plurality of dielectric blocks.

Optionally, the method further comprises forming an electron absorption layer on a side of the passivation layer distal to the first electrode; and forming a plurality of second vias in the electron absorption layer, each of which corresponds to a corresponding one of the plurality of first vias.

Optionally, the method further comprises forming a gate electrode on the first substrate; forming a gate insulating layer on a side of the gate electrode distal to the first substrate; forming an active layer on a side of the gate insulating layer distal to the first substrate; and forming a source electrode and a drain electrode on a side of the active layer distal to the first substrate.

Optionally, the first electrode is on a side of the gate insulating layer distal to the first substrate, and is connected to the drain electrode.

In another aspect, the present invention provides a method of manufacturing a display panel, comprising fabricating an array substrate according to a method described herein; forming a second substrate facing the first substrate; forming a second electrode on a side of the second substrate proximal to the first substrate; and forming a phosphor layer on a side of the second electrode proximal to the first substrate.

Optionally, the method further comprises forming a spacer between the first substrate and the second substrate.

Optionally, the spacer and the dielectric layer are formed in a single process.

In another aspect, the present invention provides a method of driving a display panel described herein or manufactured by a method described herein, comprising providing a negative voltage to the first electrode; and providing a positive voltage to the second electrode.

Optionally, electrons are emitted from the second end of the at least one electron emission source toward the phosphor layer.

In another aspect, the present invention provides a display panel comprising the array substrate described herein or fabricated by a method described herein, a second substrate facing the first substrate; a second electrode on a side of the second substrate proximal to the first substrate; a phosphor layer on a side of the second electrode proximal to the first substrate.

Optionally, a display panel further comprises a spacer between the first substrate and the second substrate.

Optionally, the spacer is in a same layer as the dielectric layer.

In another aspect, the present invention provides a display device comprising a display panel described herein or manufactured by a method described herein.

BRIEF DESCRIPTION OF THE FIGURES

The following drawings are merely examples for illustrative purposes according to various disclosed embodiments and are not intended to limit the scope of the present invention.

DETAILED DESCRIPTION

Figure 1:
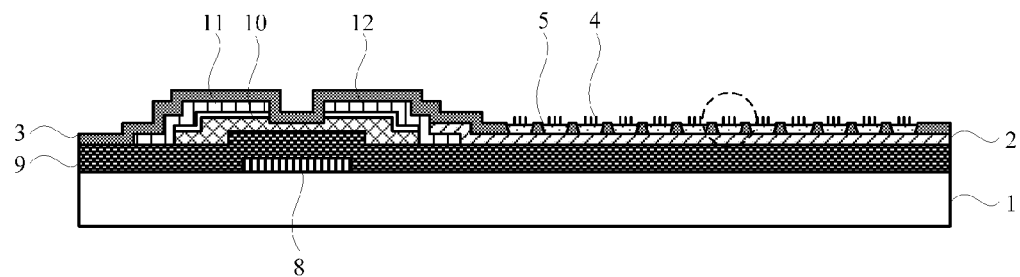
FIG. 1 is a diagram illustrating the structure of an array substrate in some embodiments.

The disclosure will now describe more specifically with reference to the following embodiments. It is to be noted that the following descriptions of some embodiments are presented herein for purpose of illustration and description only. It is not intended to be exhaustive or to be limited to the precise form disclosed.

The present disclosure at least partially alleviates several problems associated with conventional field emission displays. First, in conventional field emission displays, electron emission sources are not evenly distributed, and emission efficiencies of electron emission sources are not uniform. Second, electron emission sources in conventional field emission displays interfere with each other, further lowering the emission efficiencies of electron emission sources. All these contribute to non-uniformity in display brightness throughout the display panel and in some cases limited brightness of the display panel. Typically, electron emission sources are made of one-dimensional or quasi-one-dimensional nano-structures. Limited by conventional manufacturing process, not all nano-structures are completely separated from each other or parallel to each other, i.e., some nano-structures intersect with each other. As a result, field emission effects of these nano-structures interfere with each other, lowering the emission efficiencies of electron emission sources.

In one aspect, the present disclosure provides a field emission display array substrate having superior electronic properties as compared to the conventional field emission displays. In some embodiments, the array substrate includes a first electrode on a first substrate, a passivation layer on a side of the first electrode distal to the first substrate, an electron emission source layer on a side of the first electrode distal to the first substrate, and a dielectric layer on a side of the first electrode distal to the first substrate. The passivation layer includes a plurality of first vias, each of which corresponds to a different part of the first electrode. The vias extend through the passivation layer so that the electron emission source layer can be in contact with the first electrode. The electron emission source layer includes at least one electron emission source in each of the plurality of first vias. The at least one electron emission source has a first end and a second end, a first portion having the first end, and a second portion having the second end. The dielectric layer includes a plurality of dielectric blocks corresponding to the plurality of first vias. At least a portion of each of the plurality of dielectric blocks is in each of the plurality of first vias, e.g., in a one-to-one relationship. The first end of the at least one electron emission source is in contact with the first electrode, and the first portion of the at least one electron emission source is within a corresponding one of the plurality of dielectric blocks. The second portion and the second end of the at least one electron emission source are outside the corresponding one of the plurality of dielectric blocks. When a voltage is applied to a display panel having the array substrate, the second end of the at least one electron emission source emits electrons toward a phosphor layer in the display panel. The phosphor layer emits light upon receiving electrons from the second end of the at least one electron emission source.

FIG. 1 is a diagram illustrating the structure of an array substrate in some embodiments. Referring to FIG. 1, the array substrate in the embodiment includes a first substrate 1, a first electrode 2 on the first substrate 1, and a passivation layer 3 on a side of the first electrode 2 distal to the first substrate 1. The passivation layer 3 includes a plurality of first vias, each of which corresponds to a different part of the first electrode. The array substrate further includes an electron emission source layer on a side of the first electrode 2 distal to the first substrate 1. The electron emission source layer includes at least one electron emission source 4 in each of the plurality of first vias. Optionally, the electron emission source 4 has a one-dimensional or quasi-one-dimensional structure. The array substrate further includes a dielectric layer 5 on a side of the first electrode 2 distal to the first substrate 1. The dielectric layer 5 includes a plurality of dielectric blocks corresponding to the plurality of first vias. At least a portion of each of the plurality of dielectric blocks is in each of the plurality of first vias in a one-to-one relationship. The dielectric block partially covers the electron emission source 4, exposing one end of the electron emission source 4. The dielectric layer 5 is made of a dielectric material. Optionally, the dielectric layer 5 is made of a material different from that of the passivation layer 3.

By having one end of the electron emission source 4 buried within the dielectric layer 5 and the other end exposed outside the dielectric layer 5, emission efficiency of the electron emission source 4 is dramatically improved. The interference of field emission effects among the electron emission sources 4, particularly the interference within the portions proximal to the first electrode 2 (now buried under the dielectric layer 5), is significantly reduced or eliminated. As discussed above, not all electron emission sources 4 are separated or parallel to each other, i.e., some electron emission sources 4 intersect with each other. By covering up the intersected portions of the electron emission sources 4 within the dielectric layer 5, any interference of field emission effects generated by these intersected portions can be avoided.

Figure 4:
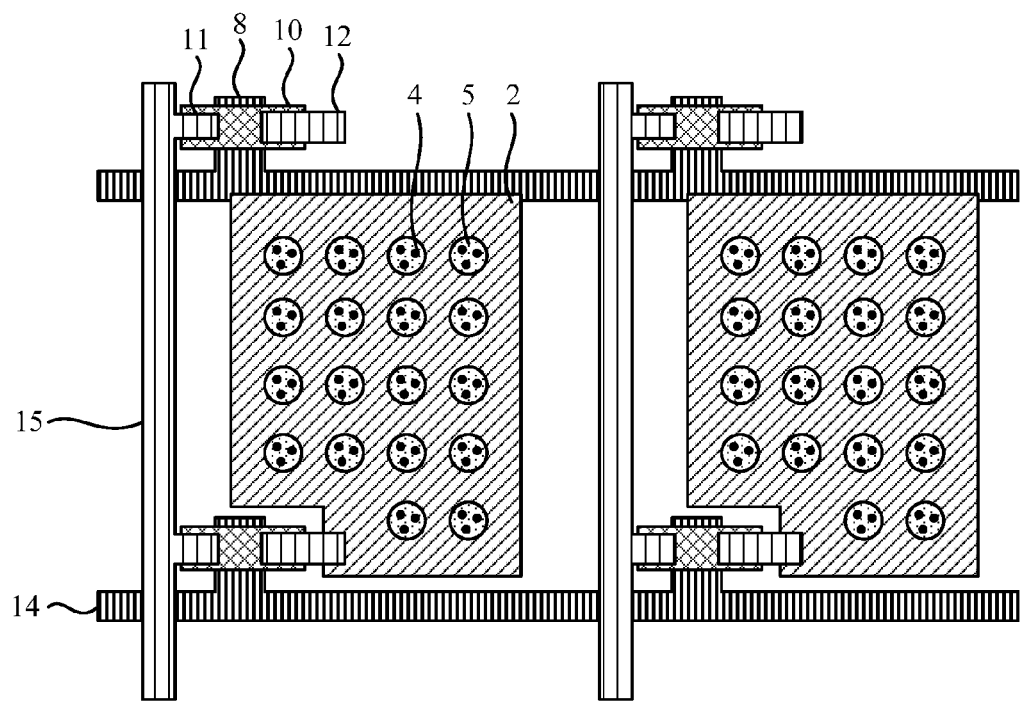
FIG. 4 is a plan view of the array substrate in some embodiments.

FIG. 4 is a plan view of the array substrate as shown in FIG. 1. As shown in FIG. 4, the array substrate in the embodiment further includes a gate line 14 connected to a gate electrode 8, and a data line 15. The data lines 15 and thin film transistors on the array substrate form an addressable array. When a thin film transistor in a pixel is addressed, a voltage is applied between the first electrode 2 (e.g., a cathode) on the array substrate and a second electrode 6 (e.g., an anode) on the second substrate (see FIG. 7). Optionally, a negative voltage is provided to the first electrode 2 and a positive voltage is provided to the second electrode 6, thereby forming an electrode field between the first electrode 2 and the second electrode 6 with a direction from the second electrode 6 to the first electrode 2. Driven by the electric field, the exposed end of the electron emission source 4 emits electrons toward a phosphor layer 7 (see FIG. 7). The phosphor layer 7 emits light upon bombardment by the electrons, providing light for the pixel.

Depending on the material and structure of the electron emission source 4, the number of the electron emission sources 4 in each first via may vary. For example, the array substrate may include at least one, at least 3 (as shown in FIG. 1), at least 5, at least 10, at least 20, at least 50, at least 100, at least 250, at least 500, at least 1000, or more, in each first via. The number of the electron emission sources 4 in each first via may be substantially the same or may be different. For example, the number of the electron emission sources 4 may be different but all within a certain range, e.g., 1-20, 20-100, 100-250, 250-500, or 500-1000. Optionally, the number of the electron emission sources 4 in each first via is substantially the same, i.e., the distribution of the electron emission sources 4 throughout the first vias is substantially homogenous. Depending on the manufacturing needs and other design reasons, the first via may be made of any appropriate shape and size, e.g., a round shape or a square. Optionally, the array substrate may further include other components necessary for the function of an array substrate.

In some embodiments, the electron emission source 4 has a high aspect ratio. Optionally, the electron emission source 4 has a tapered tip. Optionally, the electron emission source 4 has a low work function. Optionally, the electron emission source 4 has a high aspect ratio, a tapered tip, and a low work function. In some embodiments, the electron emission source 4 has a one-dimensional or quasi-one-dimensional structure, e.g., a one-dimensional or quasi-one-dimensional nano-structure.

Figure 2:
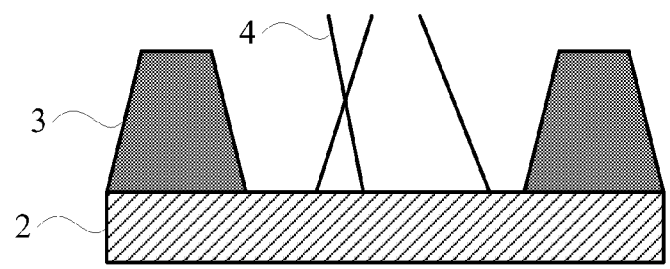
FIG. 2 is a diagram illustrating the structure of an electron emission region (the region circled by dotted line in FIG. 1) before a dielectric layer is disposed.
Figure 3:
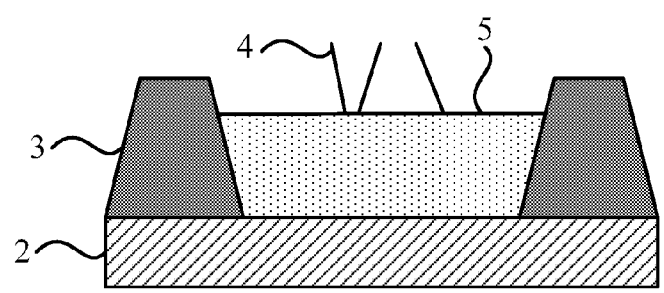
FIG. 3 is a diagram illustrating the structure of an electron emission region (the region circled by dotted line in FIG. 1) after a dielectric layer is disposed.

An electron emission source 4 having a one-dimensional or quasi-one-dimensional structure emits electrons mainly from its ends, but partially from its central region as well. In conventional manufacturing process, not all nano-structures are completely separated from each other or parallel to each other, i.e., some nano-structures intersect with each other (see, e.g., FIG. 2). As a result, electrons emitted from neighboring electron emission sources 4 may interfere with each other, lowering the emission efficiencies of electron emission sources.

By having one end of the electron emission source 4 buried within the dielectric layer 5 and the other end exposed outside the dielectric layer 5, emission efficiency of the electron emission source 4 is dramatically improved. The interference of field emission effects among the electron emission sources 4, particularly the interference within the portions proximal to the first electrode 2 (now buried under the dielectric layer 5), is significantly reduced or eliminated. As discussed above, not all electron emission sources 4 are separated or parallel to each other, i.e., some electron emission sources 4 intersect with each other. By covering up the intersected portions of the electron emission sources 4 within the dielectric layer 5, any interference of field emission effects generated by these intersected portions can be avoided. Optionally, the dielectric layer 5 is made of a resin material. Optionally, the dielectric layer 5 has substantially the same thickness as the passivation layer 3.

Figure 5:
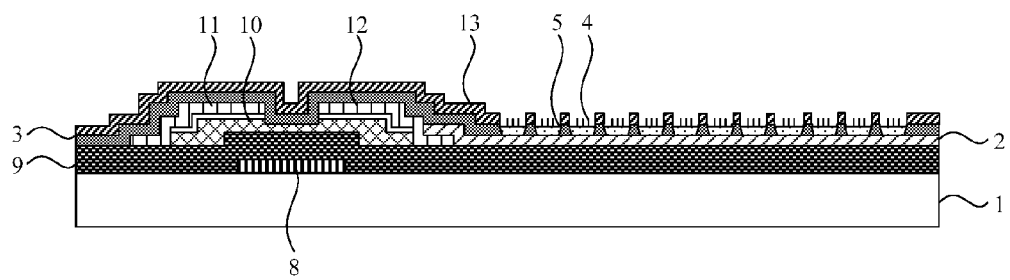
FIG. 5 is a diagram illustrating the structure of an array substrate in some embodiments.
Figure 6:
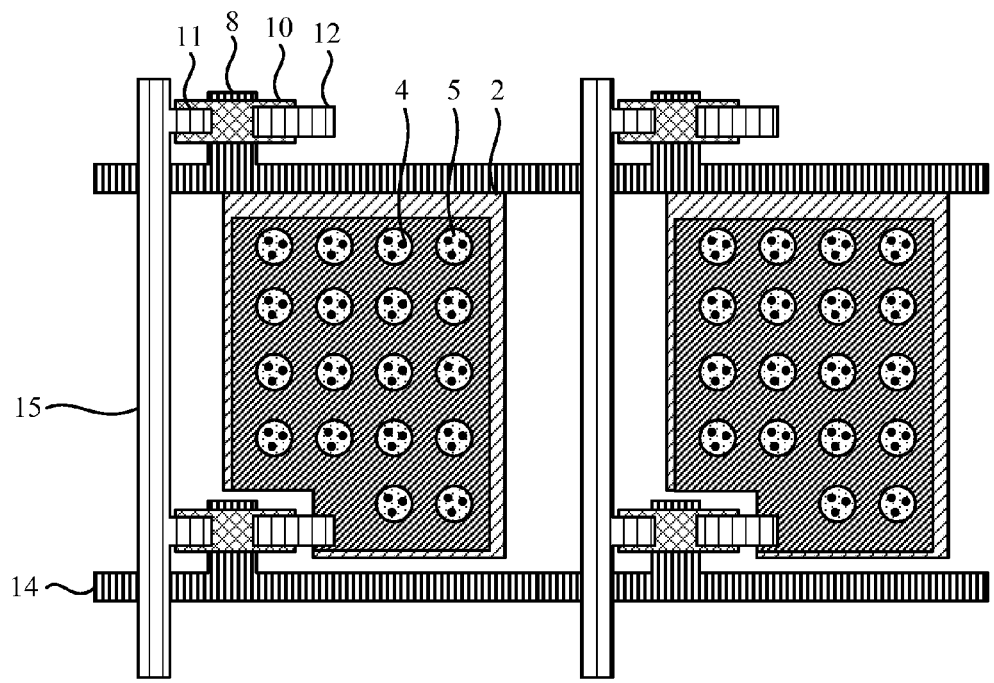
FIG. 6 is a plan view of the array substrate in some embodiments.

FIG. 5 is a diagram illustrating the structure of an array substrate in some embodiments. FIG. 6 is a plan view of the array substrate as shown in FIG. 5. Referring to FIG. 5 and FIG. 6, the array substrate in the embodiment further includes an electron absorption layer 13 on a side of the passivation layer 3 distal to the first electrode 2. The electron absorption layer 13 includes a plurality of second vias, each of which corresponds to a corresponding one of the plurality of first vias in the passivation layer 3. Optionally, the electron absorption layer is a ground metal layer or a grid electrode plate.

By having an electron absorption layer 13, any electrons emitted from the electron emission sources 4 along a direction away from corresponding pixel area in the phosphor layer will be absorbed by the electron absorption layer 13. Optionally, any electrons exiting the second via travel toward the phosphor layer along a direction substantially toward, and substantially perpendicular to, the phosphor layer (or the second electrode). Optionally, any electrons exiting the second via travel toward the phosphor layer along a direction substantially away from, and substantially perpendicular to, the first electrode 2 (or the passivation layer 3 or the electron absorption layer 13). Optionally, all electrons exiting each second via all travel substantially along a same direction. Optionally, substantially all electrons exiting each second via only bombard the corresponding pixel area in the phosphor layer. Optionally, substantially all electrons exiting each second via do not bombard a neighboring pixel area in the phosphor layer. This ensures an accurate control of light emitting in each pixel area of the phosphor layer.

Optionally, each of the plurality of second vias is no smaller than the corresponding one of the plurality of first vias. By having this design, substantially all electrons targeting the same corresponding pixel area in the phosphor layer will pass through the electron absorption layer 13. Optionally, the electron absorption layer is a ground metal layer or a grid electrode plate.

In some embodiments, the array substrate further includes a gate electrode 8 on the first substrate 1, a gate insulating layer 9 on a side of the gate electrode 8 distal to the first substrate 1, an active layer 10 on a side of the gate insulating layer 9 distal to the first substrate 1, and a source electrode 11 and a drain electrode 12 on a side of the active layer 10 distal to the first substrate 1. Optionally, the array substrate further includes an ohmic contact layer on a side of the active layer 10 distal to the first substrate 1. Optionally, the ohmic contact layer is connected to the source electrode 11 and the drain electrode 12, respectively. Optionally, the first electrode 2 is on a side of the gate insulating layer 9 distal to the first substrate 1, and is connected to the drain electrode 12.

The dielectric layer 5 may be made of any appropriate dielectric material. For example, the dielectric layer 5 may be made of an inorganic dielectric material or an organic dielectric material. The dielectric layer 5 may be made of a material that is the same as, or different from, that of the passivation layer 3. Optionally, the dielectric layer 5 is made of a material comprising resin.

The electron emission source 4 may have any appropriate shape and dimension. For example, the electron emission source 4 may be a one-dimensional or quasi-one-dimensional structure, e.g., a one-dimensional or quasi-one-dimensional nano-structure. Optionally, the electron emission source 4 has a shape selected from a group consisting of a rod, a wire, and a cone. For example, the electron emission source 4 may be a nano-structure having a shape selected from a group consisting of a rod, a wire, and a cone.

Field emission can be expressed by the Fowler-Nordheim equation: $I=sAF^2/\varphi \exp(-B^{3/2}/F)$, wherein $F=I\beta V$. I denotes field emission current, s denotes field emission area, A denotes constant, F denotes field strength, $\varphi$ is work function, B is constant, $\beta$ is field concentration coefficient, and V is application voltage. The field concentration coefficient $\beta$ is a coefficient for converting the application voltage V to the field strength F(V/cm) in accordance with the shape of the tip portion and the geometric shape of a apparatus. The smaller the work function $\varphi$ of a material is and the larger the field concentration coefficient $\beta$ is, the stronger the field emission current I becomes, and the field emission current I increases. Thus, according to Fowler-Nordheim equation, at least two factors may affect field emission. The first factor is the shape of the electron emission source 4, including the shape of the tip portion of the electron emission source 4. The second factor is the work function $\varphi$ of the material used for making the electron emission source 4. The higher the aspect ratio of the electron emission source 4 is and the more tapered the tip portion of the electron emission source 4 is, the stronger the field emission current I becomes. Similarly, the smaller the work function $\varphi$ of the material is, the stronger the field emission current I becomes. Optionally, the electron emission source 4 is a nano-structure having a shape selected from a group consisting of a rod, a wire, and a cone for achieving a stronger field emission current.

The electron emission source 4 may be made of any appropriate material. In some embodiments, the electron emission source 4 may be made of one or a combination of a carbon nano-tube and a semiconductor oxide. Optionally, the semiconductor oxide is one or a combination of zinc oxide, tungsten oxide, or indium oxide. For example, the carbon nano-tube may be a doped carbon nano-tube, the semiconductor oxide may be a doped semiconductor oxide. A doped material such as a doped carbon nano-tube and a doped semiconductor oxide in some cases has a lower work function as compared to an un-doped material. Thus, by doping the material, the work function of the material may be lowered in some cases, thereby enhancing the emission efficiency of the electron emission source 4.

Figure 7:
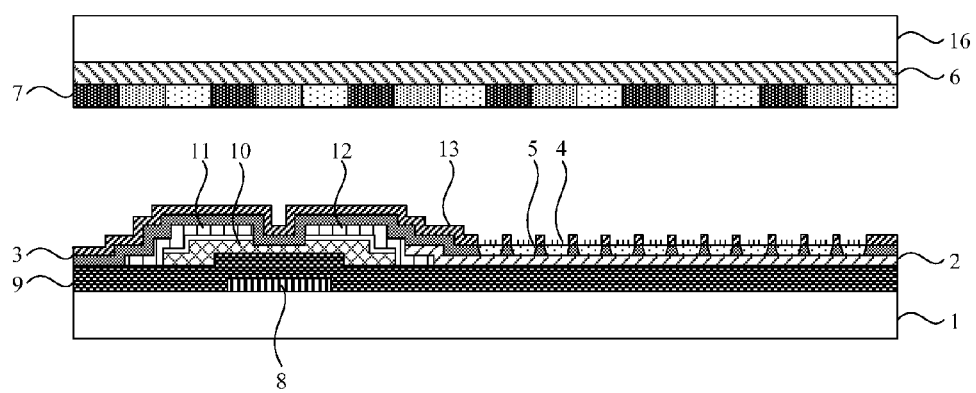
FIG. 7 is a diagram illustrating the structure of a display panel in some embodiments.

FIG. 7 is a diagram illustrating the structure of a display panel in some embodiments. Referring to FIG. 7, the display panel in the embodiment includes an array substrate described herein, and further includes a second substrate 16 facing the first substrate 1, a second electrode 6 on a side of the second substrate 16 proximal to the first substrate 1; a phosphor layer 7 on a side of the second electrode 6 proximal to the first substrate 1.

Optionally, the second electrode 6 is an anode, and the first electrode 2 is a cathode. Optionally, a negative voltage is applied to the first electrode 2 and a positive voltage is applied to the second electrode 6 to form an electric field between the second electrode 6 and the first electrode 2, with an electric field direction from the second electrode 6 to the first electrode 2. Driven by the electric field, electrons are emitted from the electron emission source 4 and travel toward the phosphor layer 7. The pixel area in the phosphor layer 7 bombarded by the electrons emits light.

In some embodiments, the display panel further includes a spacer between the first substrate and the second substrate. Optionally, the spacer is in a same layer as the dielectric layer 5 (e.g., formed in a same process). Optionally, the spacer and the dielectric layer 5 are made of a same material (e.g., a resin). By forming the spacer in a same layer and/or in a same process using a same material, the manufacturing process may be much simplified.

In another aspect, the present disclosure also provides a method of driving a display panel as described herein. The method includes providing a negative voltage to the first electrode 2, and providing a positive voltage to the second electrode 6. Electrons are emitted from an exposed end of the electron emission source toward the phosphor layer 7. The pixel area in the phosphor layer 7 bombarded by the electrons emits light.

Figure 8:
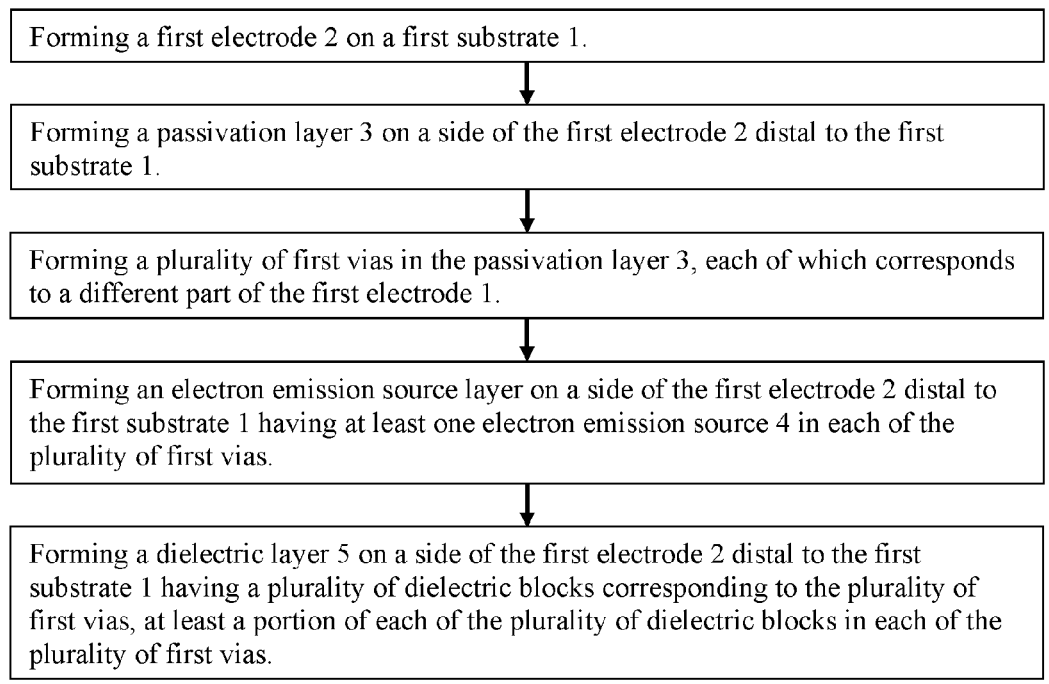
FIG. 8 is a flow chart illustrating a method of fabricating an array substrate in some embodiments.

FIG. 8 is a flow chart illustrating a method of fabricating an array substrate in some embodiments. Referring to FIG. 8, the method in the embodiment includes forming a first electrode 2 on a first substrate 1, forming a passivation layer 3 on a side of the first electrode 2 distal to the first substrate 1, forming a plurality of first vias in the passivation layer 3, each of which corresponds to a different part of the first electrode 1, forming an electron emission source layer on a side of the first electrode 2 distal to the first substrate 1 having at least one electron emission source 4 in each of the plurality of first vias, and forming a dielectric layer 5 on a side of the first electrode 2 distal to the first substrate 1 having a plurality of dielectric blocks corresponding to the plurality of first vias, at least a portion of each of the plurality of dielectric blocks in each of the plurality of first vias. Optionally, the at least one electron emission source 4 includes a first end and a second end, a first portion having the first end, and a second portion having the second end. Optionally, the first end is in contact with the first electrode 2, the first portion is within a corresponding one of the plurality of dielectric blocks. Optionally, the second portion and the second end is outside the corresponding one of the plurality of dielectric blocks. Optionally, the first electrode 2 may be formed deposition of an electrode material on the substrate, followed by UV exposure, development, baking and etching, etc. Optionally, the plurality of first vias may be spaced apart from each other and evenly distributed over the passivation layer 3. Optionally, the at least one electron emission source 4 has a one-dimensional or quasi-one-dimensional structure. Optionally, each first via includes at least one electron emission source 4.

By having one end of the electron emission source 4 buried within the dielectric layer 5 and the other end exposed outside the dielectric layer 5, emission efficiency of the electron emission source 4 is dramatically improved. The interference of field emission effects among the electron emission sources 4, particularly the interference within the portions proximal to the first electrode 2 (now buried under the dielectric layer 5), is significantly reduced or eliminated. As discussed above, not all electron emission sources 4 are separated or parallel to each other, i.e., some electron emission sources 4 intersect with each other. By covering up the intersected portions of the electron emission sources 4 within the dielectric layer 5, any interference of field emission effects generated by these intersected portions can be avoided.

In some embodiments, a photoresist layer (e.g., a layer having a thickness of around 2 μm) on the passivation layer 3. A mask having a pattern of the plurality of first vias is placed on the photoresist layer, followed by UV exposure, development, baking and etching, thereby forming the plurality of first vias. The photoresist material in the positions corresponding to the plurality of first vias is removed. A material for the electron emission source 4 is then deposited on the passivation layer 3 having the plurality of first vias. The material may be coated using any appropriate methods, including, but are not limited to, a Chemical Vapor Deposition (CVD) method, a Plasma-Enhanced Chemical Vapor Deposition (PECVD) method, and a thermal vapor deposition method. The photoresist material on the passivation layer 3 is then removed, together with any electron emission source material deposited thereon. Because the photoresist material in the positions corresponding to the plurality of first vias has been previously removed, the electron emission source material remains in the plurality of first vias. Optionally, a resin layer (e.g., a layer having a thickness of around 2 μm) is applied on the passivation layer 3. A mask having a pattern of the plurality of first vias is then placed on the resin layer, followed by UV exposure, development, baking and etching. A portion of the resin layer (e.g., a top layer of certain thickness) corresponding to the plurality of first vias is removed, exposing the second portion and the second end of the electron emission source 4.

In some embodiments, the method further includes forming an electron absorption layer 13 on a side of the passivation layer 3 distal to the first electrode 2, and forming a plurality of second vias in the electron absorption layer 13, each of which corresponds to a corresponding one of the plurality of first vias. By having an electron absorption layer 13, any electrons emitted from the electron emission sources 4 along a direction away from corresponding pixel area in the phosphor layer 7 will be absorbed by the electron absorption layer 13. Optionally, each of the plurality of second vias is no smaller than the corresponding one of the plurality of first vias.

In some embodiments, the method further includes forming a gate electrode 8 on the first substrate 1, forming a gate insulating layer 9 on a side of the gate electrode 8 distal to the first substrate 1, forming an active layer 10 on a side of the gate insulating layer 9 distal to the first substrate 1, and forming a source electrode 8 and a drain electrode 9 on a side of the active layer 10 distal to the first substrate 1. Optionally, the first electrode 2 is on a side of the gate insulating layer 9 distal to the first substrate 1, and is connected to the drain electrode 12.

In another aspect, the present disclosure also provides a method of manufacturing a display panel. In some embodiments, the method includes fabricating an array substrate according to a method described herein, forming a second substrate 16 facing the first substrate 1, forming a second electrode 6 on a side of the second substrate 16 proximal to the first substrate 1, and forming a phosphor layer 7 on a side of the second electrode 6 proximal to the first substrate 1.

In some embodiments, the method further includes forming a spacer between the first substrate 1 and the second substrate 16. Optionally, the method includes forming a spacer between the dielectric layer 5 and the phosphor layer 7. Optionally, the spacer is formed in a same process as the dielectric layer 5 (e.g., in a same layer as the dielectric layer 5). Optionally, the spacer and the dielectric layer 5 are made of a same material (e.g., a resin).

The method described herein may use any appropriate techniques. For example, layers can be formed by vapor deposition or sputtering. The various components may be patterned by, e.g., an etching process.

In conventional field emission displays, electrons emitted from neighboring electron emission sources 4 interfere with each other, lowering the emission efficiencies of electron emission sources. By having one end of the electron emission source 4 buried within the dielectric layer 5 and the other end exposed outside the dielectric layer 5, emission efficiency of the electron emission source 4 is dramatically improved. The interference of field emission effects among the electron emission sources 4, particularly the interference within the portions proximal to the first electrode 2 (now buried under the dielectric layer 5), is significantly reduced or eliminated. As discussed above, not all electron emission sources 4 are separated or parallel to each other, i.e., some electron emission sources 4 intersect with each other. By covering up the intersected portions of the electron emission sources 4 within the dielectric layer 5, any interference of field emission effects generated by these intersected portions can be avoided.

In another aspect, the present disclosure further provides a display apparatus having a display panel described herein or manufactured by a method described herein. Examples of display apparatus include, but are not limited to, an electronic paper, a mobile phone, a tablet computer, a television, a notebook computer, a digital album, a GPS, etc.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An array substrate, comprising:
   a first substrate;
   a first electrode on the first substrate;
   a passivation layer on a side of the first electrode distal to the first substrate, the array substrate comprising a plurality of first vias in the passivation layer, each of which corresponds to a different part of the first electrode;
   an electron emission source layer on a side of the first electrode distal to the first substrate comprising at least one electron emission source in each of the plurality of first vias; and
   a dielectric layer on a side of the first electrode distal to the first substrate comprising a plurality of dielectric blocks corresponding to the plurality of first vias, at least a portion of each of the plurality of dielectric blocks in each of the plurality of first vias;
   wherein the at least one electron emission source comprises a first portion having a first end and a second portion having a second end;
   the first end is in contact with the first electrode, the first portion is within a corresponding one of the plurality of dielectric blocks;
   the second portion and the second end are outside the corresponding one of the plurality of dielectric blocks; and
   the dielectric layer is made of a material consisting essentially of a resin.

2. The array substrate of claim 1, further comprising an electron absorption layer on a side of the passivation layer distal to the first electrode, the array substrate comprising a plurality of second vias in the electron absorption layer, each of which corresponds to a corresponding one of the plurality of first vias.

3. The array substrate of claim 2, wherein an orthographic projection of each of the plurality of second vias on the first substrate substantially covers an orthographic projection of the corresponding one of the plurality of first vias.

4. The array substrate of claim 2, wherein the electron absorption layer is a ground metal layer or a grid electrode plate.

5. The array substrate of claim 1, further comprising:
   a gate electrode on the first substrate;
   a gate insulating layer on a side of the gate electrode distal to the first substrate;
   an active layer on a side of the gate insulating layer distal to the first substrate; and
   a source electrode and a drain electrode on a side of the active layer distal to the first substrate;
   wherein the first electrode is on a side of the gate insulating layer distal to the first substrate, and is connected to the drain electrode.

6. The array substrate of claim 1, wherein the at least one electron emission source has a one-dimensional or quasi-one-dimensional structure.

7. The array substrate of claim 1, wherein the at least one electron emission source is a nano-structure having a shape selected from a group consisting of a rod, a wire, and a cone.

8. The array substrate of claim 7, wherein the at least one electron emission source is made of one or a combination of a carbon nano-tube and a semiconductor oxide.

9. The array substrate of claim 8, wherein the carbon nano-tube is a doped carbon nano-tube, and the semiconductor oxide is a doped semiconductor oxide.

10. A display panel, comprising the array substrate of claim 1, a second substrate facing the first substrate; a second electrode on a side of the second substrate proximal to the first substrate; a phosphor layer on a side of the second electrode proximal to the first substrate.

11. The display panel of claim 10, further comprising a spacer between the first substrate and the second substrate.

12. The display panel of claim 11, wherein the spacer is in a same layer as the dielectric layer.

13. A display apparatus comprising a display panel of claim 10.

14. The array substrate of claim 1, wherein the dielectric layer is made of a material consisting of a resin.

15. The array substrate of claim 1, wherein the dielectric layer and the passivation layer comprise a same material.

16. The array substrate of claim 1, wherein the dielectric layer and the passivation layer are made of a material consisting essentially of a resin.

17. The display panel of claim 10, wherein the array substrate further comprises an electron absorption layer on a side of the passivation layer distal to the first electrode and configured to absorb electrons emitted from electron emission sources along a direction away from corresponding pixel area in the phosphor layer, the electron absorption layer comprising a plurality of second vias, each of which corresponds to a corresponding one of the plurality of first vias.

18. The display panel of claim 11, wherein the dielectric layer and the spacer comprise a same material.

19. The display panel of claim 11, wherein the dielectric layer and the spacer are made of a material consisting essentially of a resin.

20. The display panel of claim 11, wherein the dielectric layer, the passivation layer, and the spacer are made of a material consisting essentially of a resin.

* * * * *